(12) United States Patent
Oshima

(10) Patent No.: US 11,457,526 B2
(45) Date of Patent: Sep. 27, 2022

(54) WIRING SUBSTRATE AND CURRENT MEASURING DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shinji Oshima, Himeji Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 82 days.

(21) Appl. No.: 16/942,567

(22) Filed: Jul. 29, 2020

(65) Prior Publication Data

US 2021/0243886 A1 Aug. 5, 2021

(30) Foreign Application Priority Data

Feb. 3, 2020 (JP) .............................. JP2020-016345

(51) Int. Cl.
| | | |
|---|---|---|
| *H05K 1/02* | (2006.01) | |
| *H05K 1/18* | (2006.01) | |
| *G01R 31/52* | (2020.01) | |
| *H05K 1/11* | (2006.01) | |

(52) U.S. Cl.
CPC .......... *H05K 1/0218* (2013.01); *G01R 31/52* (2020.01); *H05K 1/115* (2013.01); *H05K 1/181* (2013.01); *H05K 2201/0723* (2013.01); *H05K 2201/10151* (2013.01)

(58) Field of Classification Search
CPC ...... H05K 1/0218; H05K 1/115; H05K 1/181; H05K 2201/0723; H05K 2201/10151; H05K 1/0268; H05K 1/0298; G01R 31/52; G01R 19/0092; H01L 23/49822
USPC .......................................................... 324/544
See application file for complete search history.

(56) References Cited

U.S. PATENT DOCUMENTS

| | | | | |
|---|---|---|---|---|
| 5,357,138 A | * | 10/1994 | Kobayashi | .......... H01L 23/5383 257/664 |
| 2004/0178805 A1 | * | 9/2004 | Kitaoka | ............... G01D 5/2417 324/662 |
| 2020/0211961 A1 | * | 7/2020 | Khanolkar | .......... H01F 17/0006 |

FOREIGN PATENT DOCUMENTS

| | | |
|---|---|---|
| JP | H04-267586 A | 9/1992 |
| JP | 2738372 B2 | 4/1998 |
| JP | H11-163192 A | 6/1999 |

* cited by examiner

*Primary Examiner* — Farhana A Hoque
(74) *Attorney, Agent, or Firm* — Kim & Stewart LLP

(57) ABSTRACT

A wiring substrate includes an insulating body; a first conductor including a first shield layer provided in a first layer inside the insulating body, and a second shield layer provided in a second layer at a different position from the first layer in a thickness direction of the insulating body; a second conductor including a first guard layer provided in a third layer positioned between the first layer and the second layer in the thickness direction, and a second guard layer provided in a fourth layer positioned between the second layer and the third layer in the thickness direction; and a third conductor provided in a fifth layer positioned between the third layer and the fourth layer in the thickness direction.

16 Claims, 3 Drawing Sheets

WIRING SUBSTRATE AND CURRENT MEASURING DEVICE

CROSS-REFERENCE TO RELATED APPLICATION

This application is based upon and claims the benefit of priority from Japanese Patent Application No. 2020-016345, filed on Feb. 3, 2020; the entire contents of which are incorporated herein by reference.

FIELD

Embodiments described herein relate generally to a wiring substrate and a current measuring device.

BACKGROUND

In recent years, the minute leak current of a minute capacitance and femto ampere order and high precision measurement of high resistance came to be required by highly efficient-ization of the semiconductor device.

To conventionally measure a micro leakage current with high precision, a measurement device and a measurement object are connected with a triaxial cable. Because the triaxial cable is connected to the measurement device through-hole a connector, there are cases where height constraints arise, or it is difficult to connect the connector and the triaxial cable in locations where the connector spacing is narrow. Also, when multiple measurements are performed simultaneously, it is difficult to connect the multiple connectors to the triaxial cables, leakage occurs when the connections are performed through-hole relays, and problems occur in which the measurements cannot be performed.

DETAILED DESCRIPTION

Figure 1:
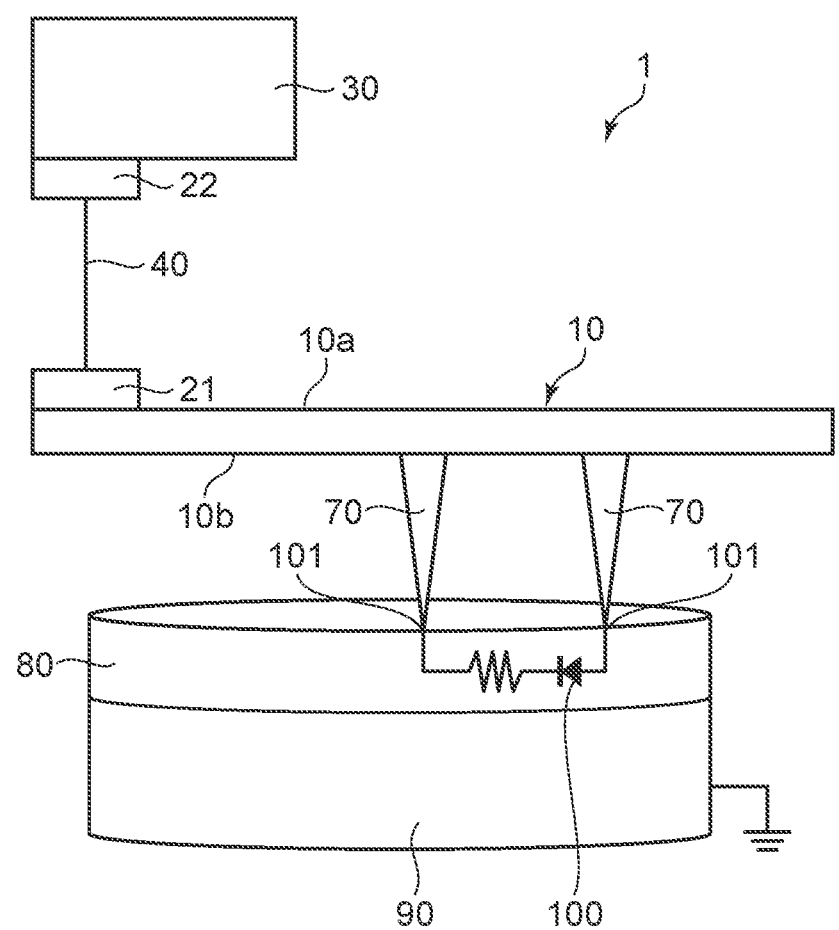
FIG. 1 is a schematic view showing a configuration of a current measuring device of an embodiment.

According to one embodiment, a wiring substrate includes an insulating body; a first conductor including a first shield layer provided in a first layer inside the insulating body, and a second shield layer provided in a second layer at a different position from the first layer in a thickness direction of the insulating body; a second conductor including a first guard layer provided in a third layer positioned between the first layer and the second layer in the thickness direction, and a second guard layer provided in a fourth layer positioned between the second layer and the third layer in the thickness direction; and a third conductor provided in a fifth layer positioned between the third layer and the fourth layer in the thickness direction.

Embodiments will now be described with reference to the drawings. The same components in the drawings are marked with the same reference numerals.

FIG. 1 is a schematic view showing a configuration of a current measuring device 1 of an embodiment.

The current measuring device 1 includes a wiring substrate 10, a probe 70, connectors 21 and 22, and a power supply unit 30.

Figure 2A:
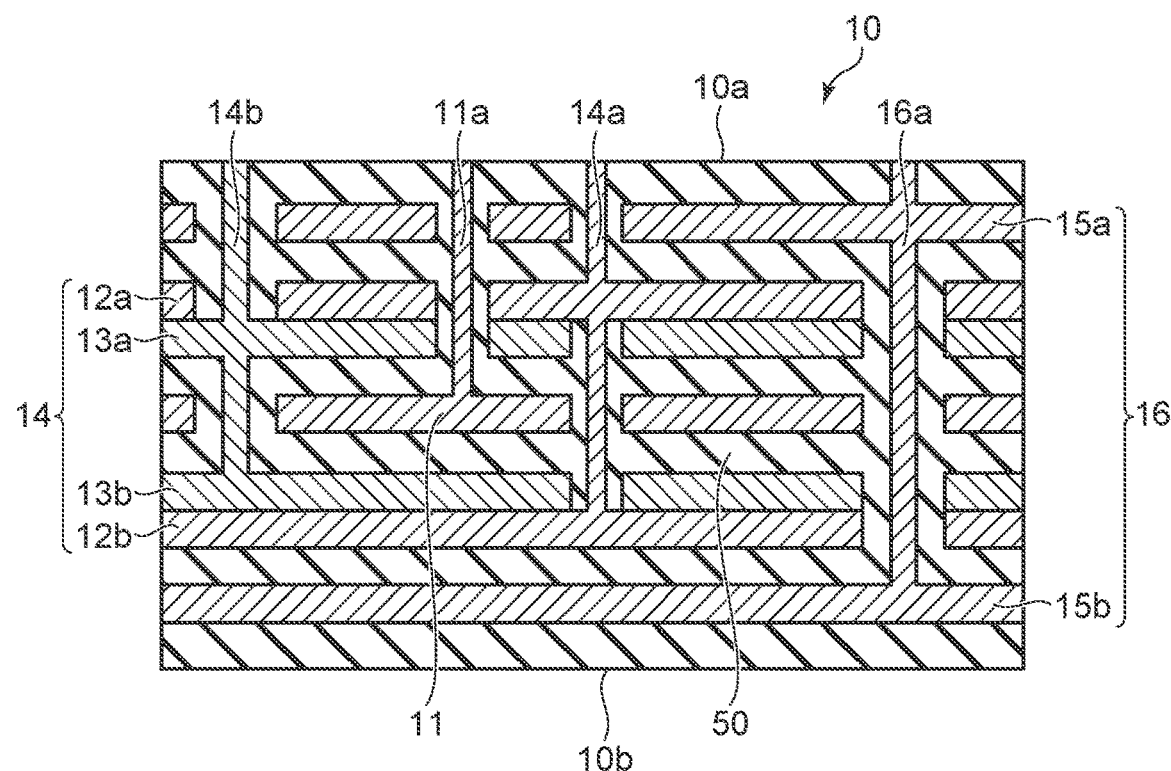
FIG. 2A is a schematic cross-sectional view of a wiring substrate of the embodiment.
Figure 2B:
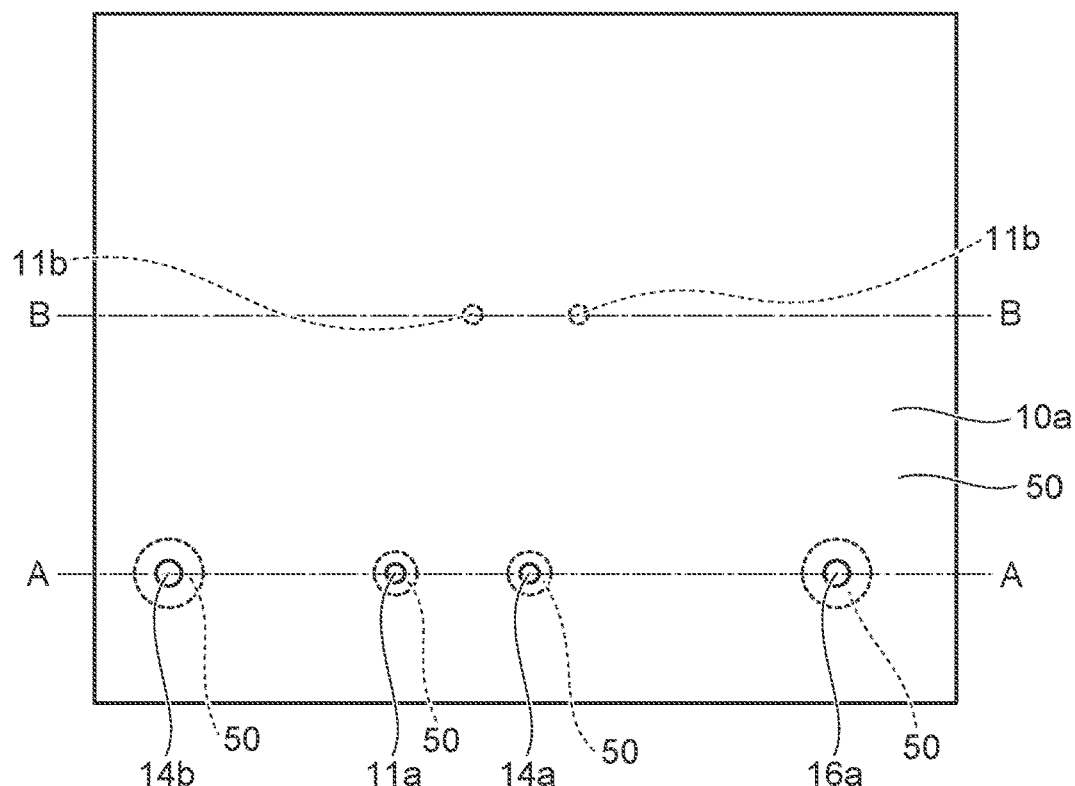
FIG. 2B is a schematic plan view of the wiring substrate of the embodiment.

FIG. 2A is a schematic cross-sectional view of a connector connection portion of the wiring substrate 10, and FIG. 2B is a schematic plan view of the wiring substrate 10. FIG. 2A is a line A-A cross-sectional view of FIG. 2B.

The wiring substrate 10 includes an insulating body 50, an outer conductor layer 16 which is a first conductor, an intermediate conductor layer 14 which is a second conductor, and a central conductor layer 11 which is a third conductor. The insulating body 50 is provided between the outer conductor layer 16 and the intermediate conductor layer 14 and between the intermediate conductor layer 14 and the central conductor layer 11. The insulating body 50 covers the surface of the outer conductor layer 16. For example, the insulating body 50 is made of a resin. The insulating body 50 may have a configuration in which a reinforcing member such as glass cloth or the like is included in a resin.

The central conductor layer 11 is provided inside the insulating body 50 and is covered with the insulating body 50. The central conductor layer 11 is a signal wire in which the current of a measuring object flows.

The outer conductor layer 16 is provided inside the insulating body 50 in a different layer from the central and intermediate conductor layers 11 and 14 and is covered with the insulating body 50. The outer conductor layer 16 includes a first shield layer 15a and a second shield layer 15b separated in the thickness direction of the insulating body 50. The outer conductor layer 16 is grounded and can absorb disturbance noise. The first shield layer 15a is provided in a first layer inside the insulating body 50. The second shield layer 15b is provided in a second layer, which is at a different position from the first layer in the thickness direction of the insulating body 50.

The intermediate conductor layer 14 is provided inside the insulating body 50 in a different layer from the central and outer conductor layers 11 and 16 and is covered with the insulating body 50. The intermediate conductor layer 14 includes a first guard layer 12a and a second guard layer 12b separated from each other in the thickness direction of the insulating body 50 between the first shield layer 15a and the second shield layer 15b.

The same potential as that of the central conductor layer 11 is applied to the intermediate conductor layer 14. The first shield layer 15a is provided in a third layer positioned between the first layer and the second layer in the thickness direction of the insulating body 50. The second shield layer 15b is provided in a fourth layer positioned between the second layer and the third layer in the thickness direction of the insulating body 50.

For example, the central conductor layer 11, the first guard layer 12a, the second guard layer 12b, the first shield layer 15a, and the second shield layer 15b are made of metals such as copper, aluminum, etc.

The intermediate conductor layer 14 further includes a first semiconductor layer 13a stacked with the first guard layer 12a, and a second semiconductor layer 13b stacked with the second guard layer 12b. The first semiconductor layer 13a is provided between the first guard layer 12a and the central conductor layer 11 and contacts the first guard layer 12a. The second semiconductor layer 13b is provided between the second guard layer 12b and the central conductor layer 11 and contacts the second guard layer 12b.

The central conductor layer 11 is provided in a fifth layer positioned between the third layer and the fourth layer in the thickness direction of the insulating body 50. The central conductor layer 11 is provided between the first semiconductor layer 13a and the second semiconductor layer 13b.

A first through-hole 11a extends in the thickness direction of the insulating body 50 between the central conductor layer 11 and a surface of the insulating body 50 forming one surface 10a of two surfaces of the wiring substrate 10, and is connected to the central conductor layer 11. The first through-hole 11a can be formed of the same material as the central conductor layer 11.

The first through-hole 11a is provided in a through-hole (shown by a broken line in FIG. 2B) extending through the insulating body 50 on the first shield layer 15a, the first shield layer 15a, the insulating body 50 between the first shield layer 15a and the first guard layer 12a, the first guard layer 12a, the first semiconductor layer 13a, and the insulating body 50 between the first semiconductor layer 13a and the central conductor layer 11. The insulating body 50 is provided between the first through-hole 11a and the first shield layer 15a, between the first through-hole 11a and the first guard layer 12a, and between the first through-hole 11a and the first semiconductor layer 13a.

Second through-hole 14a and 14b extend in the thickness direction of the insulating body 50 between the intermediate conductor layer 14 and the surface of the insulating body 50 forming the surface 10a of the wiring substrate 10, and are connected to the intermediate conductor layer 14.

The second through-hole 14a is connected to the first and second guard layers 12a and 12b, and the second through-hole 14b is connected to the first and second semiconductor layers 13a and 13b. The second through-hole 14a can be formed of the same material as the first and second guard layers 12a and 12b. The second through-hole 14b can be formed of the same material as the first and second semiconductor layers 13a and 13b or the 1st guard layer 12a, and the 2nd guard layer 12b.

The second through-hole 14a is provided in a through-hole (shown by a broken line in FIG. 2B) extending through the insulating body 50 on the first shield layer 15a and the insulating body 50 between the first shield layer 15a and the first guard layer 12a; and the second through-hole 14a is connected to the first guard layer 12a. The second through-hole 14a also is provided in a through-hole (shown by a broken line in FIG. 2B) extending through the first semiconductor layer 13a, the insulating body 50 between the first semiconductor layer 13a and the central conductor layer 11, the central conductor layer 11, the insulating body 50 between the central conductor layer 11 and the second semiconductor layer 13b, and the second semiconductor layer 13b; and the second through-hole 14a is connected to the second guard layer 12b.

The insulating body 50 is provided between the second through-hole 14a and the first shield layer 15a, between the second through-hole 14a and the first semiconductor layer 13a, between the second through-hole 14a and the central conductor layer 11, and between the second through-hole 14a and the second semiconductor layer 13b.

The second through-hole 14b is provided in a through-hole (shown by a broken line in FIG. 2B) extending through the insulating body 50 on the first shield layer 15a, the insulating body 50 between the first shield layer 15a and the first guard layer 12a, and the first guard layer 12a; and the second through-hole 14b is connected to the first semiconductor layer 13a. The second through-hole 14b also is provided in a through-hole (shown by a broken line in FIG. 2B) extending through the insulating body 50 between the first semiconductor layer 13a and the central conductor layer 11, the central conductor layer 11, and the insulating body 50 between the central conductor layer 11 and the second semiconductor layer 13b; and the second through-hole 14b is connected to the second semiconductor layer 13b.

The insulating body 50 is provided between the second through-hole 14b and the first shield layer 15a, between the second through-hole 14b and the first guard layer 12a, and between the second through-hole 14b and the central conductor layer 11.

A third through-hole 16a extends in the thickness direction of the insulating body 50 between the outer conductor layer 16 and the surface of the insulating body 50 forming the surface 10a of the wiring substrate 10, and is connected to the outer conductor layer 16. The third through-hole 16a can be formed of the same material as the outer conductor layer 16.

The third through-hole 16a is provided in a through-hole (shown by a broken line in FIG. 2B) extending through the insulating body 50 on the first shield layer 15a, and is connected to the first shield layer 15a. The third through-hole 16a also is provided in a through-hole (shown by a broken line in FIG. 2B) extending through the insulating body 50 between the first shield layer 15a and the second shield layer 15b, the first guard layer 12a, the first semiconductor layer 13a, the central conductor layer 11, the second semiconductor layer 13b, and the second guard layer 12b; and the third through-hole 16a is connected to the second shield layer 15b.

Between the 3rd beer 16a and the 2nd semiconductor layer 13b and between the 3rd beer 16a and the 2nd guard layer 12b, the insulator 50 is formed between the 3rd beer 16a and the central conductor layer 11 between the 3rd beer 16a and the 1st semiconductor layer 13a between the 3rd beer 16a and the 1st guard layer 12a.

The end portions of the first through-hole 11a, the second through-holes 14a and 14b, and the third through-hole 16a are exposed at the same surface 10a of the wiring substrate 10. The first through-hole 11a, the second through-holes 14a and 14b, and the third through-hole 16a are electrically connected to a connector 21 shown in FIG. 1. For example, the connector 21 is provided at an end portion of the surface 10a of the wiring substrate 10.

Figure 3:
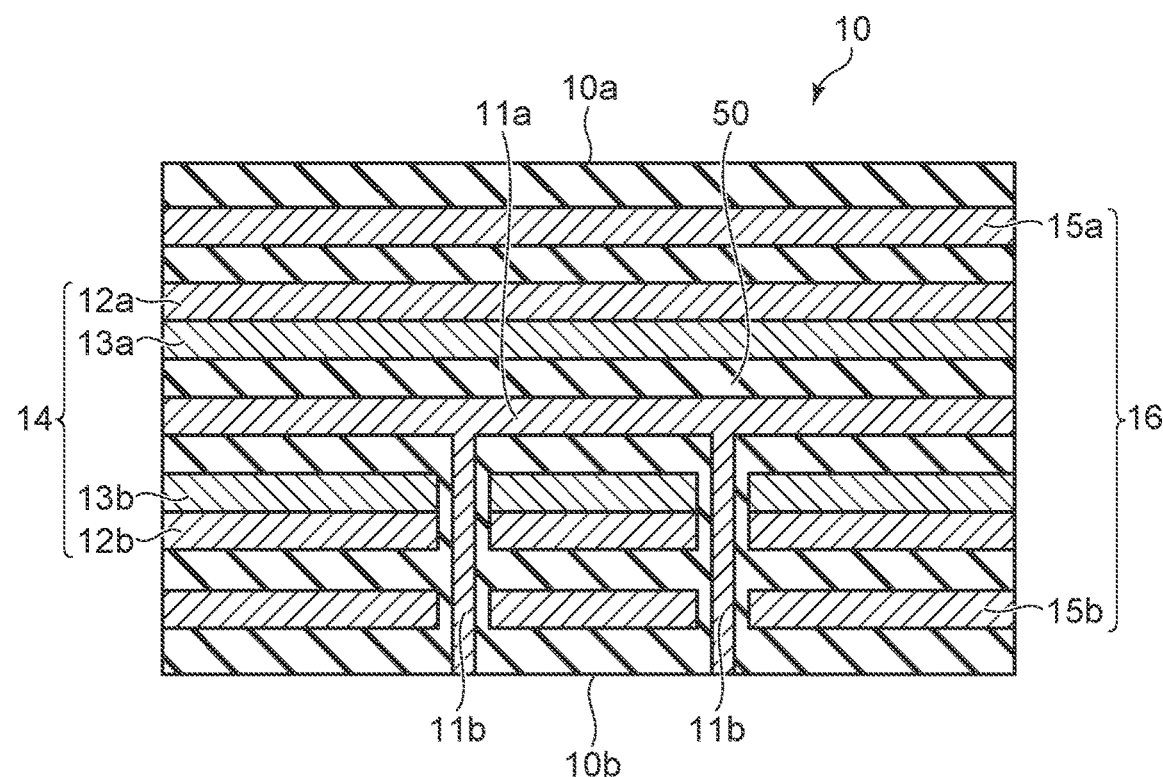
FIG. 3 is a line B-B cross-sectional view of FIG. 2A.

FIG. 3 is a schematic cross section of the probe terminal area in the wiring board 10.

Also in the wiring board 10, a probe terminal area is prepared in the central part of the direction of a field.

The central conductor layer 11 and the connector 21 are offered, and the penetration 11b connected to the probe is extended in the thickness direction of the insulator 50 between the surfaces of the insulator 50 which forms 10b of the surface of the wiring board 10 by the side with 10a opposite to the surface connected to the central conductor layer 11.

The probe connection through-hole 11b is provided in a through-hole extending through the insulating body 50 between the central conductor layer 11 and the second semiconductor layer 13b, the second semiconductor layer 13b, the second guard layer 12b, the insulating body between the second guard layer 12b and the second shield layer 15b, the second shield layer 15b, and the insulating body 50 covering the surface of the second shield layer 15b. The end portion of the probe connection through-hole 11b is exposed at the surface 10b.

The insulating body 50 is provided between the probe connection through-hole 11b and the second semiconductor layer 13b, between the probe connection through-hole 11b and the second guard layer 12b, and between the probe connection through-hole 11b and the second shield layer 15b.

Figure 4:
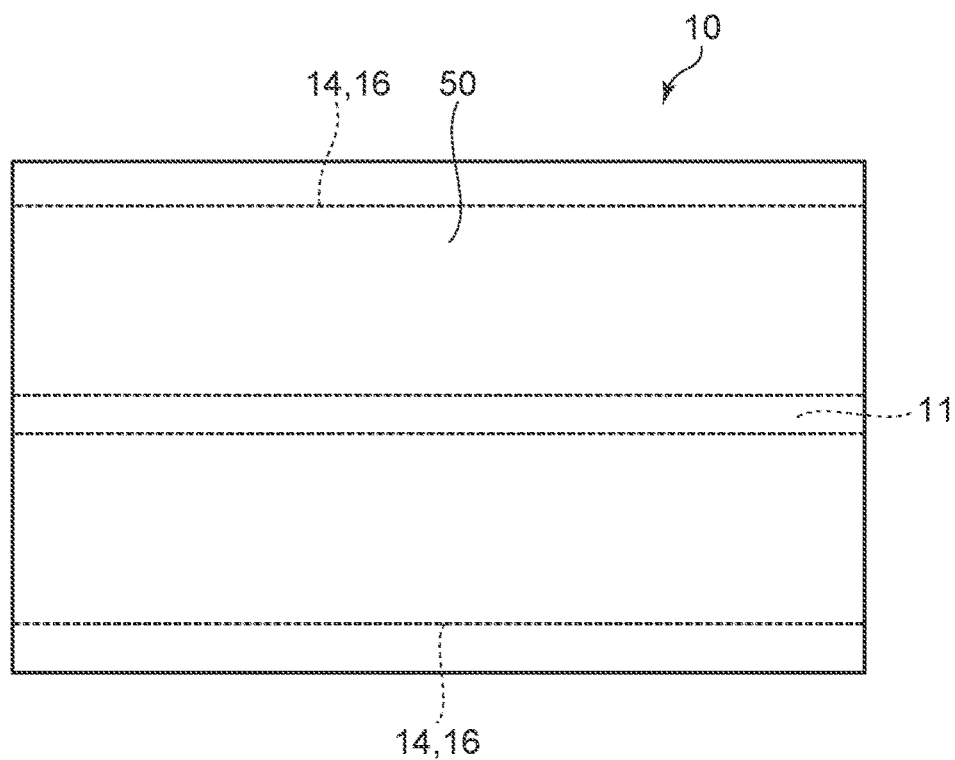
FIG. 4 is a schematic plan view of the wiring substrate of the embodiment.

FIG. 4 is a schematic plan view of the wiring substrate 10 and illustrates the central conductor layer 11, the intermediate conductor layer 14, and the outer conductor layer 16 as broken lines (hidden lines).

As shown in FIG. 4, the central conductor layer 11 is formed in a line configuration, and the intermediate conductor layer 14 and the outer conductor layer 16 each have greater surface areas (widths) than the central conductor layer 11.

The probe 70 shown in FIG. 1 is provided at the central portion of the surface 10b of the wiring substrate 10 and is electrically connected to the central conductor layer 11 through-hole the probe connection through-hole 11b shown in FIG. 3. The probe 70 directly protrudes from the surface 10b of the wiring substrate 10 toward the measurement object. The probe 70 has a triaxial or coaxial structure.

The connector 21 is provided at the end portion of the surface 10a of the wiring substrate 10 and is electrically connected to the central conductor layer 11, the intermediate conductor layer 14, and the outer conductor layer 16 by the through-holes 11a, 14a, 14b, and 16a shown in FIGS. 2A and 2B.

As shown in FIG. 1, the connector 21 is electrically connected to the power supply unit 30 via a triaxial cable 40. The power supply unit 30 is connected to the triaxial cable 40 via the connector 22. The power supply unit 30 is, for example, a source measure unit that can measure the voltage and the current while simultaneously supplying the voltage and the current.

The measurement object of the current measuring device 1 of the embodiment is, for example, an avalanche photodiode 100 formed in a semiconductor wafer 80. The semiconductor wafer 80 is supported on a grounded chuck 90. The tips of the probes 70 contact pads 101 corresponding to the anode and cathode of the avalanche photodiode 100.

The surface 10b of the wiring substrate 10 at which the probes 70 are provided faces the semiconductor wafer 80, and the connector 21 is provided at the surface 10a at the side opposite to the surface 10b; therefore, the connector 21 does not obstruct the measurement.

A micro current that flows through the avalanche photodiode 100 is measured by the power supply unit 30 through-hole the probe 70, the probe connection through-hole 11b, the central conductor layer 11, the connector 21, the triaxial cable 40, and the connector 22.

When measuring a micro current, even when the central conductor layer 11 and the outer conductor layer 16 are separated by the insulating body 50, a large error may occur in the measured value because a slight current (a leakage current) leaks from the central conductor layer 11 to the outer conductor layer 16.

According to the structure of the embodiment, the intermediate conductor layer 14 also is sandwiched between the central conductor layer 11 and the outer conductor layer 16. When measuring a micro current, the intermediate conductor layer 14 is driven by the power supply unit 30 to have the same potential as the central conductor layer 11. Thereby, the potential difference between the central conductor layer 11 and the intermediate conductor layer 14 is substantially zero; therefore, a leakage current from the central conductor layer 11 to the intermediate conductor layer 14 does not occur, and the measurement error can be avoided. Although a leakage current occurs due to a potential difference between the intermediate conductor layer 14 and the outer conductor layer 16 at this time, this current is supplied from the power supply unit 30 and does not pass through the measurement system, and therefore does not affect the measured value.

Because the connector 21 and the probe 70 are connected by the wiring substrate 10 instead of a cable, the connection between the connector 21 and the wiring substrate 10 is easy by through-holes even for height constraints or locations where the connector spacing is narrow. When multiple measurements are simultaneously performed, the connections are easy between the wiring substrate 10 and the multiple connectors 21.

Considering the draw-out of the triaxial cable 40, it is desirable to provide the connector 21 at the end portion of the surface 10a of the wiring substrate 10. To reduce the leakage current to a minimum, it is also desirable for the through-holes 11a, 14a, 14b, and 16a that are connected to the connector 21 to be positioned at the end portion of the surface 10a of the wiring substrate 10.

Regardless of the position of the connector 21, it is possible to reduce the leakage current to a minimum by forming the through-holes 11a, 14a, 14b, and 16a directly under the connector 21.

The intermediate conductor layer 14 may include only the guard layers 12a and 12b without including the semiconductor layers 13a and 13b. Effects such as the following are obtained by using the stacked structure of the guard layers 12a and 12b and the semiconductor layers 13a and 13b as the intermediate conductor layer 14. The leakage current between the intermediate conductor layer 14 and the central conductor layer 11 is low because the intermediate conductor layer 14 and the central conductor layer 11 have the same potential; furthermore, the leakage current can be better suppressed to a minimum because the leakage that does occur is from the semiconductor layers 13a and 13b that are charged from the guard layers 12a and 12b to have the same potential as the central conductor layer 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A wiring substrate, comprising:
   an insulating body;
   a first conductor including
      a first shield layer provided in a first layer inside the insulating body, and
      a second shield layer provided in a second layer at a different position from the first layer in a thickness direction of the insulating body;
   a second conductor including
      a first guard layer provided in a third layer positioned between the first layer and the second layer in the thickness direction, and
      a second guard layer provided in a fourth layer positioned between the second layer and the third layer in the thickness direction; and
   a third conductor provided in a fifth layer positioned between the third layer and the fourth layer in the thickness direction.

2. The wiring substrate according to claim 1, further comprising:
- a first through-hole extending in the thickness direction between the third conductor and a surface of the insulating body, the first through-hole being connected to the third conductor;
- a second through-hole extending in the thickness direction between the second conductor and the surface of the insulating body, the second through-hole being connected to the second conductor; and
- a third through-hole extending in the thickness direction between the first conductor and the surface of the insulating body, the third through-hole being connected to the first conductor.

3. The wiring substrate according to claim 2, wherein an end portion of the first through-hole, an end portion of the second through-hole, and an end portion of the third through-hole are exposed at a same surface of the insulating body.

4. The wiring substrate according to claim 1, wherein the second conductor further includes a first semiconductor layer stacked with the first guard layer, and a second semiconductor layer stacked with the second guard layer.

5. The wiring substrate according to claim 1, wherein the third conductor is formed in a line configuration, and the second conductor and the first conductor each have greater surface areas than the third conductor.

6. The wiring substrate according to claim 1, wherein the first conductor is grounded.

7. The wiring substrate according to claim 1, wherein a same potential is applied to the second and third conductors.

8. The wiring substrate according to claim 1, wherein the first shield layer, the second shield layer, the first guard layer, the second guard layer, and the third conductor are metal layers.

9. A current measuring device, comprising:
- the wiring substrate according to claim 1;
- a probe provided at one surface of two surfaces of the wiring substrate, the probe being connected to the third conductor;
- a connector provided at the other surface of the two surfaces of the wiring substrate, the connector being connected to the first, second, and third conductors; and
- a power supply unit connected to the connector.

10. The wiring substrate according to claim 9, further comprising:
- a first through-hole extending in the thickness direction between the third conductor and a surface of the insulating body, the first through-hole being connected to the third conductor;
- a second through-hole extending in the thickness direction between the second conductor and the surface of the insulating body, the second through-hole being connected to the second conductor; and
- a third through-hole extending in the thickness direction between the first conductor and the surface of the insulating body, the third through-hole being connected to the first conductor.

11. The wiring substrate according to claim 10, wherein an end portion of the first through-hole, an end portion of the second through-hole, and an end portion of the third through-hole are exposed at a same surface of the insulating body, and are connected to the connector.

12. The wiring substrate according to claim 9, wherein the second conductor further includes a first semiconductor layer stacked with the first guard layer, and a second semiconductor layer stacked with the second guard layer.

13. The wiring substrate according to claim 9, wherein the third conductor is formed in a line configuration, and the second conductor and the first conductor each have greater surface areas than the third conductor.

14. The wiring substrate according to claim 9, wherein the first conductor is grounded.

15. The wiring substrate according to claim 9, wherein a same potential is applied to the second and third conductors.

16. The wiring substrate according to claim 9, wherein the first shield layer, the second shield layer, the first guard layer, the second guard layer, and the third conductor are metal layers.

* * * * *